(12) United States Patent
Chen et al.

(10) Patent No.: US 11,355,061 B2
(45) Date of Patent: Jun. 7, 2022

(54) PIXEL CIRCUIT, DRIVING METHOD THEREFOR, AND DISPLAY APPARATUS

(71) Applicant: BOE Technology Group Co., Ltd., Beijing (CN)

(72) Inventors: Liang Chen, Beijing (CN); Lei Wang, Beijing (CN); Li Xiao, Beijing (CN); Dongni Liu, Beijing (CN); Detao Zhao, Beijing (CN); Ning Cong, Beijing (CN); Minghua Xuan, Beijing (CN); Shengji Yang, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 136 days.

(21) Appl. No.: 16/757,526

(22) PCT Filed: Aug. 7, 2019

(86) PCT No.: PCT/CN2019/099531
§ 371 (c)(1),
(2) Date: Apr. 20, 2020

(87) PCT Pub. No.: WO2020/048281
PCT Pub. Date: Mar. 12, 2020

(65) Prior Publication Data
US 2021/0375204 A1 Dec. 2, 2021

(30) Foreign Application Priority Data

Sep. 6, 2018 (CN) .......................... 201811039872.3

(51) Int. Cl.
*G09G 3/3233* (2016.01)
*G09G 3/3258* (2016.01)
*H01L 27/32* (2006.01)

(52) U.S. Cl.
CPC .......... *G09G 3/3233* (2013.01); *G09G 3/3258* (2013.01); *H01L 27/3262* (2013.01);
(Continued)

(58) Field of Classification Search
CPC ......... G09G 3/30–3291; G09G 3/3233; G09G 2300/0819; G09G 2300/0861;
(Continued)

(56) References Cited

U.S. PATENT DOCUMENTS

2005/0057455 A1* 3/2005 Peng .................... G09G 3/3208
345/76
2005/0110725 A1 5/2005 Kwak et al.
(Continued)

FOREIGN PATENT DOCUMENTS

CN 1622173 A 6/2005
CN 102222468 A 10/2011
(Continued)

OTHER PUBLICATIONS

First Office Action and English language translation, CN Application No. 201811039872.3, dated Oct. 24, 2019, 22 pp.
(Continued)

*Primary Examiner* — Sanjiv D. Patel
(74) *Attorney, Agent, or Firm* — Myers Bigel, P.A.

(57) ABSTRACT

The present disclosure relates to a pixel circuit, a driving method therefor, and a display apparatus. The pixel circuit includes an input sub-circuit, a light emission control sub-circuit and an organic light-emitting transistor. The input sub-circuit is coupled to a gate line, a data line and the light emission control sub-circuit and writes a data signal supplied via the data line into the light emission control sub-circuit under control of a gate scan signal supplied via the gate line. The light emission control sub-circuit is coupled to a control electrode of the organic light-emitting transistor and controls a control electrode voltage of the organic light-emitting transistor according to a written data signal to drive the organic light-emitting transistor to emit light. With the pixel circuit according to embodiments of the present disclosure, active driving of an organic light-emitting transistor is achieved when it is applied in a display apparatus.

14 Claims, 6 Drawing Sheets

(52) U.S. Cl.
CPC ............. *G09G 2310/027* (2013.01); *G09G 2310/0272* (2013.01)

(58) Field of Classification Search
CPC ..... G09G 2300/0842; G09G 2320/043; G09G 2300/0852; G09G 2320/0233; G09G 3/3258; G09G 2320/045; G09G 3/3208; G09G 2300/0426; G09G 2300/0809; H01L 27/32–3297
See application file for complete search history.

(56) References Cited

U.S. PATENT DOCUMENTS

| | | | |
|---|---|---|---|
| 2013/0240842 A1 | 9/2013 | Liu et al. | |
| 2013/0240847 A1* | 9/2013 | Zakhidov | H01L 51/56 257/40 |
| 2016/0019836 A1 | 1/2016 | Qing et al. | |
| 2016/0125803 A1 | 5/2016 | Qing et al. | |
| 2016/0233459 A1* | 8/2016 | Tanaka | H01L 51/5296 |
| 2018/0197479 A1* | 7/2018 | Chen | G09G 3/3233 |
| 2019/0378464 A1 | 12/2019 | Chen et al. | |

FOREIGN PATENT DOCUMENTS

| | | |
|---|---|---|
| CN | 103366682 A | 10/2013 |
| CN | 103460424 A | 12/2013 |
| CN | 203325414 U | 12/2013 |
| CN | 103551149 A | 1/2014 |
| CN | 106097972 A | 11/2016 |
| CN | 108806594 A | 11/2018 |
| CN | 109036283 A | 12/2018 |
| EP | 2911214 A1 | 8/2015 |

OTHER PUBLICATIONS

International Search Report with English language translation, International Application No. PCT/CN2019/099531, dated Nov. 4, 2019, 6 pp.

* cited by examiner

PIXEL CIRCUIT, DRIVING METHOD THEREFOR, AND DISPLAY APPARATUS

RELATED APPLICATIONS

The present application is a 35 U.S.C. 371 national stage application of PCT International Application No. PCT/CN2019/099531, filed on Aug. 7, 2019, which claims the benefit of Chinese Patent Application No. 201811039872.3, filed on Sep. 6, 2018, the entire disclosures of which are incorporated herein by reference.

TECHNICAL FIELD

The present disclosure relates to the field of display technology, and in particular, to a pixel circuit, a driving method therefor, and a display apparatus.

BACKGROUND

An organic light-emitting transistor (OLET) has both a circuit modulation function of an organic field-effect transistor (OFET) and a light-emitting function of an organic light-emitting diode (OLED). In theory, an OLET can have higher carrier mobility, as well as better luminous efficiency and light emission intensity, than an OLED, and thus will be of great application value in the fields of flat panel display, optical communication, solid-state lighting, and electrically pumped organic laser, etc.

SUMMARY

According to a first aspect of the present disclosure, a pixel circuit is provided. The pixel circuit comprises an input sub-circuit, a light emission control sub-circuit, and an organic light-emitting transistor. The input sub-circuit is coupled to a gate line, a data line, and the light emission control sub-circuit, and is configured to write a data signal supplied via the data line into the light emission control sub-circuit under control of a gate scan signal supplied via the gate line. The light emission control sub-circuit is coupled to a control electrode of the organic light-emitting transistor, and is configured to control a control electrode voltage of the organic light-emitting transistor according to the written data signal to drive the organic light-emitting transistor to emit light.

In alternative embodiments, the organic light-emitting transistor comprises a first electrode coupled to a second voltage terminal, and is configured to emit light under driving of a driving current corresponding to the data signal and a second voltage signal supplied via the second voltage terminal.

In alternative embodiments, the pixel circuit further comprises a light emission-off sub-circuit. The light emission-off sub-circuit is coupled to a pulse width modulation signal line and the control electrode of the organic light-emitting transistor, and is configured to control the organic light-emitting transistor to stop emitting light according to a pulse width modulation signal supplied via the pulse width modulation signal line. A duty cycle of the pulse width modulation signal is determined from a gray scale to be displayed by the pixel circuit.

In alternative embodiments, a voltage of the data signal is the control electrode voltage of the organic light-emitting transistor that makes it emit light at a maximum light emission intensity.

In alternative embodiments, the light emission-off sub-circuit comprises a first transistor. A control electrode of the first transistor is coupled to the pulse width modulation signal line, a first electrode of the first transistor is coupled to a third voltage terminal, and a second electrode of the first transistor is coupled to the control electrode of the organic light-emitting transistor. The first transistor is configured to be turned on when the pulse width modulation signal is at an active level, so as to control the organic light-emitting transistor to stop emitting light by applying a third voltage signal supplied via the third voltage terminal to the control electrode of the organic light-emitting transistor.

In alternative embodiments, the first voltage terminal is coupled to the second voltage terminal.

In alternative embodiments, the organic light-emitting transistor is a bipolar organic light-emitting transistor. The second voltage terminal is configured to supply an AC voltage signal as the second voltage signal.

In alternative embodiments, the second voltage terminal is configured to, during every two consecutive frames, supply a positive polarity voltage signal and a negative polarity voltage signal alternately on a per frame basis.

In alternative embodiments, the input sub-circuit comprises a second transistor. A control electrode of the second transistor is coupled to the gate line, a first electrode of the second transistor is coupled to the data line, and a second electrode of the second transistor is coupled to the light emission control sub-circuit.

In alternative embodiments, the light emission control sub-circuit comprises a storage capacitor. A first terminal of the storage capacitor is coupled to the first voltage terminal, and a second terminal of the storage capacitor is coupled to the control electrode of the organic light-emitting transistor and an output terminal of the input sub-circuit.

In alternative embodiments, the second voltage terminal comprises a power supply voltage terminal. A second electrode of the organic light-emitting transistor is coupled to a common voltage terminal.

According to a second aspect of the present disclosure, a driving method for a pixel circuit is provided. The pixel circuit comprises an input sub-circuit, a light emission control sub-circuit, and an organic light-emitting transistor. The driving method comprises: during a frame period for a frame to be displayed: writing, by the input sub-circuit in a data writing phase, a data signal supplied via a data line into the light emission control sub-circuit under control of a gate scan signal supplied via a gate line; and driving, by the light emission control sub-circuit in a light emission phase, the organic light emitting field effect transistor to emit light according to the written data signal.

In alternative embodiments, the writing the data signal supplied via the data line into the light emission control sub-circuit comprises: maintaining, at a control electrode of the organic light-emitting transistor, a control electrode voltage corresponding to the data signal by supplying a first voltage signal to the light emission control sub-circuit. Controlling the light emission of the organic light-emitting transistor by the light emission control sub-circuit according to the written data signal comprises: supplying a second voltage signal to a first electrode of the organic light-emitting transistor, and driving the organic light-emitting transistor to emit light through a driving current corresponding to the data signal and the second voltage signal.

In alternative embodiments, a voltage of the data signal is determined from a gray scale to be displayed by the pixel circuit.

In alternative embodiments, the frame period further comprises a light emission-off phase. The driving method further comprises: controlling, in the light emission-off phase, the organic light-emitting transistor to stop emitting light by applying a third voltage signal to a control electrode of the organic light-emitting transistor. A duration of the light emission phase is determined from a gray scale of a pixel or a sub-pixel of the frame to be displayed.

In alternative embodiments, a voltage of the data signal is a control electrode voltage of the organic light-emitting transistor that makes it emit light at a maximum light emission intensity.

In alternative embodiments, the organic light-emitting transistor is a bipolar organic light-emitting transistor, and the second voltage signal is an AC voltage signal.

In alternative embodiments, during every two consecutive frames, a positive polarity voltage signal and a negative polarity voltage signal are alternately supplied to a first electrode of the organic light-emitting transistor on a per frame basis.

According to a third aspect of the present disclosure, a display apparatus is provided. The display apparatus comprises the pixel circuit as described above.

According to a fourth aspect of the present disclosure, a signal processor is provided. The signal processor is for use with the pixel circuit as described above in which the light emission-off sub-circuit is included. The signal processor is configured to calculate a duty cycle of a pulse width modulation signal from a gray scale to be displayed by the pixel circuit, and to generate and output a corresponding pulse width modulation signal to the light emission-off sub-circuit in the pixel circuit.

BRIEF DESCRIPTION OF THE DRAWINGS

The aforementioned and other features and advantages of the present disclosure will become more apparent when specific embodiments are described in detail with reference to the drawings. In the drawings.

DETAILED DESCRIPTION

In order to facilitate understanding, the pixel circuit, the driving method, and the display apparatus provided by embodiments of the present disclosure are described in detail below in conjunction with the accompanying drawings.

Figure 1:
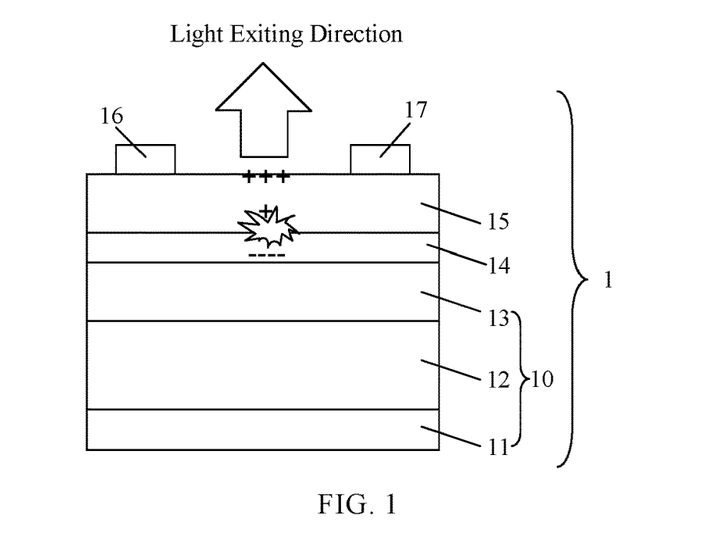
FIG. 1 is a schematic structural diagram of an OLET.

An organic light-emitting transistor has both a circuit modulation function of an organic field-effect transistor and a light-emitting function of an organic light-emitting diode. The OLET is a heterojunction bipolar device, and one of its typical structures is shown in FIG. 1. As shown in FIG. 1, an OLET 1 includes a gate electrode 10, an electron transport layer 14, and a hole transport layer 15 sequentially stacked along a light exiting direction, as well as a source electrode 16 and a drain electrode 17 provided on a surface of the hole transport layer 15. The gate electrode 10 is generally composed of an aluminum conductive layer 11, an N-type silicon conductive layer 12, and a silicon dioxide layer 13 that are sequentially stacked.

Figure 2:
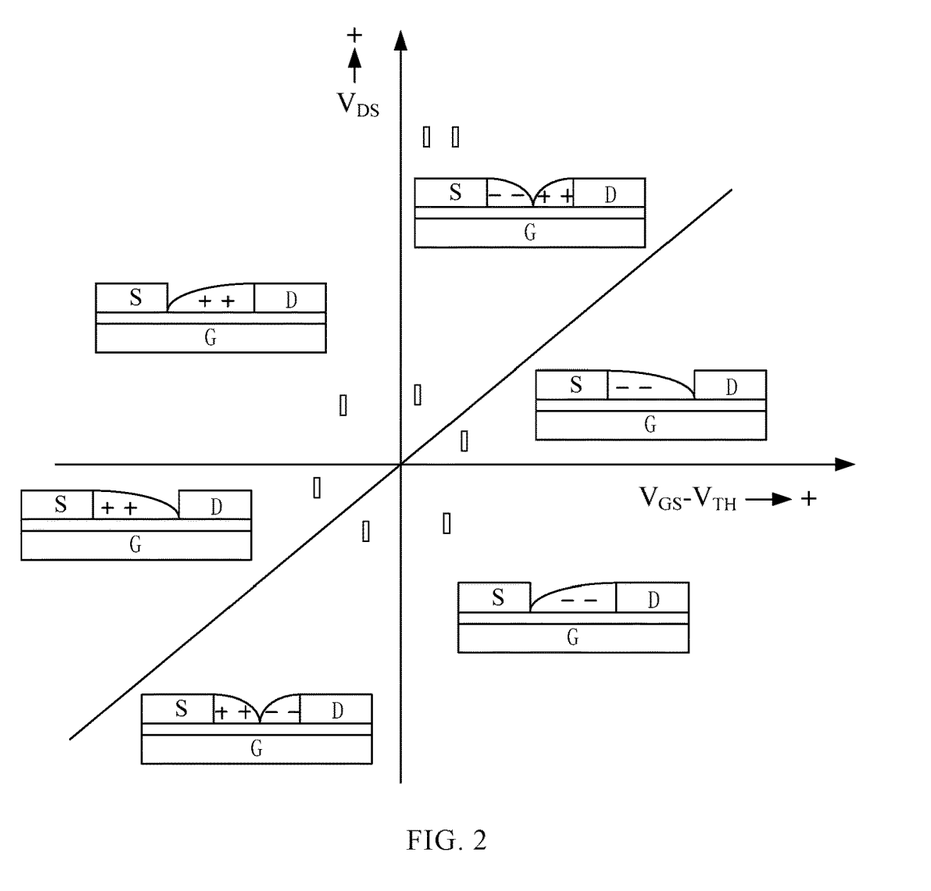
FIG. 2 is a working state diagram of an OLET under different voltages.

FIG. 2 shows a working state diagram of an OLET under different voltages. Taking the OLET 1 in FIG. 1 as an example, the injection barrier of carriers, i.e. electrons and holes, can be adjusted through a bias voltage $V_{GS}$ between its gate electrode 10 and source electrode 16 and a lateral electric field $V_{DS}$ between the source electrode 16 and the drain electrode 17. The amount of electrons and holes injected can then be controlled accordingly, such that the carriers injected into the electron transport layer 14 and the hole transport layer 15 can form a channel current under the lateral electric field $V_{DS}$. Depending upon the bias voltage $V_{GS}$ and the lateral electric field $V_{DS}$ applied in the OLET, the OLET may generally work in six states ①-⑥ as shown in FIG. 2, where $V_{TH}$ is the threshold voltage that turns the OLET on.

In state ①, when $V_{GS}-V_{TH}>0$, electrons can be injected from the source electrode 16 by overcoming the injection barrier, and when $V_{DS}<V_{GS}-V_{TH}$, holes cannot be injected from the drain electrode 17 by overcoming the injection barrier. Such injected electrons may move toward the drain electrode 17 under the lateral electric field $V_{DS}$ and are collected by the drain electrode 17. The OLET is in an electron-transporting state, and the channel current of the OLET mainly manifests as an electron current.

In state ②, as $V_{DS}$ is increases toward positive polarity, the injection barrier of the holes gradually decreases. After being injected from the drain electrode 17 by overcoming the injection barrier, the holes can also move toward the source electrode 16 and be collected by the source electrode 16 under the lateral electric field $V_{DS}$. In this way, the OLET is in a state in which electrons and holes are transported simultaneously, and the channel current of the OLET mainly manifests as the sum of an electron current and a hole current.

In state ③, when $V_{GS}-V_{TH}<0$ and $V_{DS}>0$, electrons cannot be injected from the source electrode 16 by overcoming the injection barrier, while holes can be injected from the drain electrode 17 by overcoming the injection barrier. Such injected holes move toward the source electrode 16 under the lateral electric field $V_{DS}$ and are collected by the source electrode 16. The OLET is then in a hole-transporting state, and the channel current of OLET mainly manifests as a hole current.

In state ④, as $V_{DS}$ increases toward the negative polarity, the injection barrier of the holes at the drain electrode 17 gradually increases, and the number of the holes injected from the drain electrode 17 by overcoming the injection barrier gradually decreases. When $V_{DS}$<0, the lateral electric field $V_{DS}$ between the source electrode 16 and the drain electrode 17 changes in an opposite direction, and the holes will be injected from the source electrode 16 and collected by the drain electrode 17. In this way, the OLET is still in the hole-transporting state, and the channel current of the OLET mainly manifests as a hole current.

In state ⑤, when $V_{DS}$ further increases toward negative polarity such that its absolute value is greater than ($V_{GS}-V_{TH}$), electrons can be injected from the drain electrode 17 by overcoming the injection barrier, and the electrons can also move toward the source electrode 16 under the lateral electric field $V_{DS}$ and collected by the source electrode 16. In this way, the OLET is in the state in which the electrons and the holes are transported simultaneously, and the channel current of the OLET mainly manifests as the sum of an electron current and a hole current.

In state ⑥, when $V_{GS}-V_{TH}$>0 and $V_{DS}$<0, only the electrons can be injected from the drain electrode 17 by overcoming the injection barrier and collected by the source electrode 16. In this way, the OLET is in the electron-transporting state, and the channel current of OLET mainly manifests as an electron current.

Figure 3:
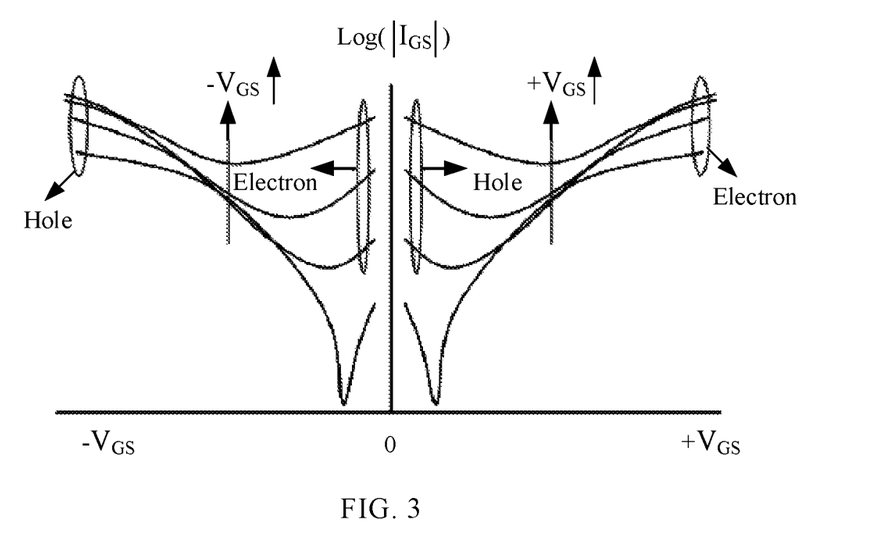
FIG. 3 is a transfer characteristic diagram of carriers in an OLET.
Figure 4:
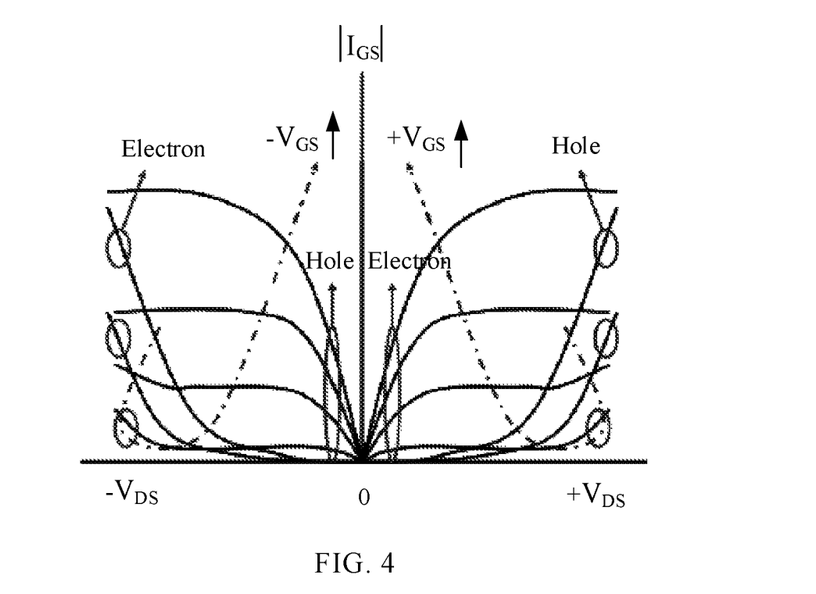
FIG. 4 is an output characteristic diagram of carriers in an OLET.

FIG. 3 shows the transfer characteristics of carriers in a bipolar OLET, and FIG. 4 shows the output characteristics of carriers in the bipolar OLET. It can be seen from FIG. 3 and FIG. 4 that the injection barrier of the carriers in the OLET varies with the OLET bias voltage $V_{GS}$ and the lateral electric field $V_{DS}$. Therefore, the injection of the electrons and holes in the OLET will constantly change, and there will be no state where the electrons or holes are completely blocked. That is to say, the channel current of the OLET will always manifest as the sum of an electron current and a hole current, except that the electron current and the hole current will be subject to a relative change in magnitude, namely, either the electron current or the hole current may be the main current in a certain state.

The related art has given calculation formulas of different channel currents for the above-mentioned working states of an OLET. For details, please refer to "Electron and Ambipolar Transport in Organic Field-Effect Transistors, Chemical Reviews, 2007, 107(4): 1296-1323." In the related art, it is assumed that the mobility of carriers in an OLET depends upon the gate voltage, and the six working states of the OLET can be divided into a unipolar linear region, a unipolar saturation region, and a bipolar region, depending upon different bias voltage $V_{GS}$ and lateral electric field $V_{DS}$ applied in the OLET. The unipolar linear region refers to a region where the channel current is mainly either an electron current or a hole current, and the channel current changes linearly. The unipolar saturation region refers to a region where the channel current is mainly either an electron current or a hole current, and the channel current is in a saturated state. The bipolar region refers to a region where an electron current and a hole current exist simultaneously.

Since the OLET is generally of a heterojunction bipolar structure, it is required to work in the bipolar region, i.e., state ② and state ⑤ shown in FIG. 2, for normal light emission, which is a region where an electron current and a hole current exist simultaneously.

Figure 5:
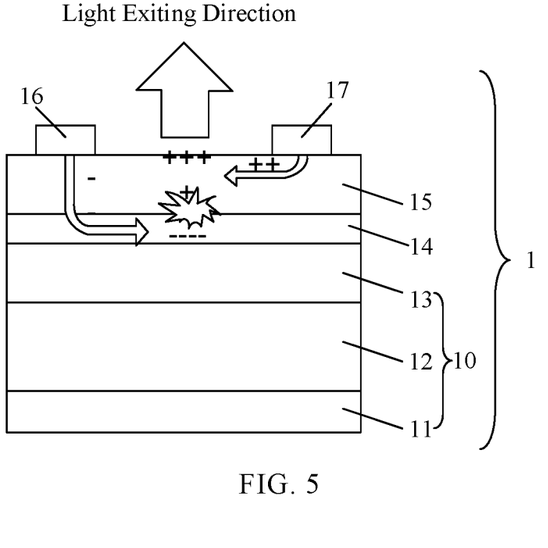
FIG. 5 is a schematic diagram of carrier transfer in state ②0 of the OLET shown in FIG. 2.
Figure 6:
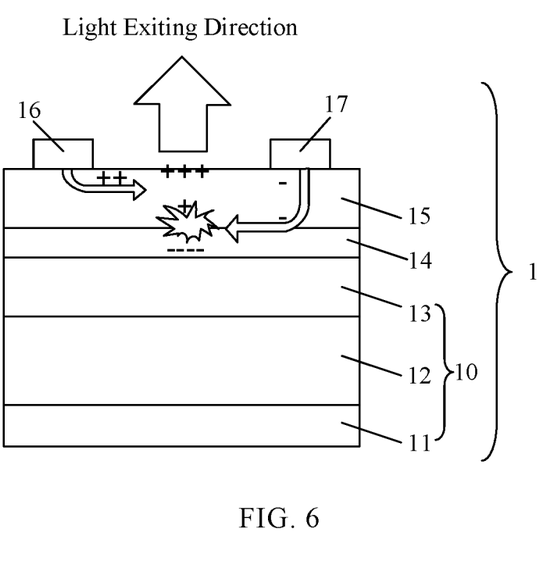
FIG. 6 is a schematic diagram of carrier transfer in state ⑤ of the OLET shown in FIG. 2.

FIGS. 5 and 6 show a carrier transport path upon application of AC power to a source electrode and a drain electrode of an OLET in a case where the source electrode and the drain electrode are symmetrical. The carrier transport path of an OLET in state ② is shown in FIG. 5, and the carrier transport path of an OLET in state ⑤ is shown in FIG. 6. It is assumed that for the OLET the hole injection barrier voltage $V_{TH-h}$<the electron injection barrier voltage $V_{TH-e}$. Then, when $V_{GS}$>$V_{Th-e}$ and $(V_{GS}-V_{TH-h})\leq V_{DS} \leq (V_{GS}-V_{TH-e})$, or $|V_{GS}|>|V_{Th-e}|$ and $(V_{GS}-V_{TH-h})\leq V_{DS} \leq (V_{GS}-V_{TH-e})$, the channel current $I_{DS}$ of the OLET includes two parts: an electron current $I_{DS-e}$ and a hole current $I_{DS-h}$, which are:

the electronic current $|I_{DS-e}|=WC_i/(2L)[\mu_e(V_{GS}-V_{TH-e})^2]$ (1);

the hole current $|I_{DS-h}|=WC_i/(2L)[\mu_h(V_{DS}-(V_{GS}-V_{TH-h}))^2]$ (2);

the channel current $|I_{DS}|=WC_i/(2L)[\mu_e(V_{GS}-V_{TH-e})^2+\mu_h(V_{DS}-(V_{GS}-V_{TH-h}))^2]$ (3);

where W is the channel width of the OLET, $C_i$ is the unit gate capacitance of the OLET, L is the channel length of the OLET, $\mu_e$ is the electron mobility of the OLET, and $\mu_h$ is the hole mobility of the OLET.

Figure 7:
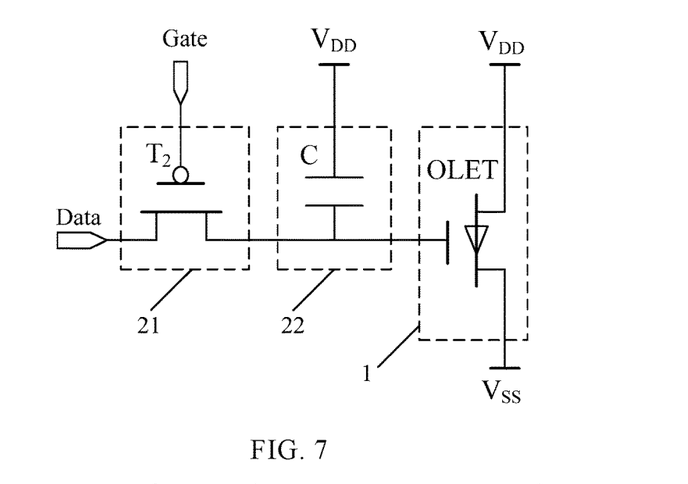
FIG. 7 is a schematic structural diagram of a pixel circuit according to an embodiment of the present disclosure.

FIG. 7 shows a pixel circuit according to an embodiment of the present disclosure. The pixel circuit includes an input sub-circuit 21, a light emission control sub-circuit 22, and an OLET 1. The input sub-circuit 21 is coupled to a gate line Gate, a data line Data, and the light emission control sub-circuit 22, and is configured to write a data signal $V_{Data}$ supplied via the data line Data into the light emission control sub-circuit 22 under the control of a gate scan signal $V_{Gate}$ supplied via the gate line Gate. The light emission control sub-circuit 22 is coupled to a control electrode of the OLET 1 and is configured to control a voltage of a control electrode of the organic light-emitting transistor according to the written data signal to drive the organic light-emitting transistor to emit light.

In some embodiments, the light emission control sub-circuit 22 has a first terminal coupled to a first voltage terminal and a second terminal coupled to an output terminal of the input sub-circuit 21 and the control electrode of the OLET 1, and is configured to maintain a control electrode voltage corresponding to the data signal at the control electrode of the organic light-emitting transistor, by utilizing a first voltage signal supplied via the first voltage terminal. Exemplarily, the light emission control sub-circuit 22 is configured to receive at its second terminal a data signal outputted from the input sub-circuit 21 when the pixel circuit is addressed by the gate scan signal, and maintain the data signal at the control electrode of the OLET 1 to supply a control electrode voltage corresponding to the data signal when the pixel circuit is not addressed by the gate scan signal. A first electrode of the OLET 1 is coupled to a second voltage terminal, and the OLET 1 is configured to emit light under the driving of a driving current corresponding to the data signal and a second voltage signal supplied via the second voltage terminal. It can be understood that the magnitude of the driving current of the OLET 1 depends upon the control electrode voltage of its control electrode and the second voltage of the first electrode that is supplied via the second voltage terminal. The light emission intensity of the OLET 1 may vary with the driving current. In some embodiments, the voltage of the data signal is determined from a gray scale to be displayed by the pixel circuit. It can be understood that the gray scale to be displayed by the pixel circuit is determined based on the gray scale of an image pixel (including sub-pixels) in an image frame to be displayed that corresponds to the pixel circuit.

The control electrode of the OLET 1 generally refers to the gate electrode of the OLET 1. The OLET 1 further includes a second electrode disposed corresponding to the first electrode. When its first electrode is the source electrode, the second electrode is the drain electrode. When its first electrode is the drain electrode, the second electrode is the source electrode. In this embodiment, the first electrode of the OLET 1 is coupled to the second voltage terminal. The second voltage terminal may be a power supply voltage terminal, for supplying a power supply voltage signal $V_{DD}$ as the second voltage signal. The second electrode of the OLET 1 may be coupled to a common voltage terminal. The common voltage terminal is configured to supply a common voltage signal Vss. When the light emission control sub-circuit 22 controls the OLET 1 to emit light according to a data signal, the OLET 1 can emit light under the driving of the data signal $V_{Data}$ and the power supply voltage signal $V_{DD}$. Generally, the potential of Vss is smaller than the potential of $V_{DD}$. For example, Vss may be a low level and $V_{DD}$ is a high level.

In alternative embodiments, the input sub-circuit 21 includes a second transistor $T_2$. A control electrode of the second transistor $T_2$ is coupled to the gate line Gate, a first electrode of the second transistor $T_2$ is coupled to the data line Data, and the second electrode of the second transistor $T_2$ is coupled, as its output terminal, for example, to the light emission control sub-circuit 22. The second transistor $T_2$ is configured to be turned on when the pixel circuit is addressed by the gate scan signal, i.e., when the gate scan signal is at an active level, so as to output the data signal $V_{Data}$ to the light emission control sub-circuit 22. The second transistor $T_2$ is further configured to be turned off when the pixel circuit is not addressed by the gate scan signal, i.e., when the gate scan signal is at an inactive level. The second transistor $T_2$ may be an N-type or a P-type transistor. Exemplarily, a P-type transistor may be used to function as the second transistor $T_2$.

In alternative embodiments, the light emission control sub-circuit 22 includes a storage capacitor C. A first terminal of the storage capacitor C is coupled to the first voltage terminal, and a second terminal of the storage capacitor C is coupled to the control electrode of the OLET 1 and the output terminal of the input sub-circuit 21. The storage capacitor C is configured to receive at its second terminal a data signal when the pixel circuit is addressed by the gate scan signal, and is charged with the first voltage signal inputted from the first voltage terminal, so as to maintain the data signal at the control electrode of the OLET 1, when the pixel circuit is not addressed by the gate scan signal.

In some embodiments, the first voltage terminal may be coupled to the second voltage terminal, that is, the first voltage terminal and the second voltage terminal may be configured to supply the same voltage signal, such as the power supply voltage signal $V_{DD}$ shown in FIG. 7. Alternatively, the first voltage terminal and the second voltage terminal may be configured to supply different voltage signals. For example, the first voltage terminal may be configured to supply the common voltage signal Vss, and the second voltage terminal may be configured to supply the power supply voltage signal $V_{DD}$. The voltage signals supplied via the first voltage terminal and the second voltage terminal may be set as appropriate, and are not limited thereto.

Embodiments of the present disclosure provide a pixel circuit according to a light emitting principle of an OLET, so as to actively drive the OLET when the OLET is applied to a display apparatus. The pixel circuit can use the input sub-circuit 21 to write the data signal $V_{Data}$ supplied via the data line Data into the light emission control sub-circuit 22 when the OLET 1 is addressed, i.e., under control of the gate scan signal $V_{Gate}$ supplied via the gate line Gate. Then, the OLET 1 is controlled to emit light by the light emission control sub-circuit 22 according to the written data signal $V_{Data}$. In one example, the light emission control sub-circuit 22 maintains the control electrode voltage of the OLET 1 at an on-voltage (i.e., a voltage that turns on the OLET 1) according to the written data signal $V_{Data}$. For example, the voltage of the written data signal $V_{Data}$ may be set to be equal to the on-voltage. In this way, a conducting current (i.e., a driving current) between the first electrode and the second electrode of the OLET 1 may be formed under the driving of the data signal $V_{Data}$ and the second voltage signal supplied via the second voltage terminal, thereby performing light emission display. The light-emission duration of the OLET 1 depends upon a duration in which the light-emission control sub-circuit 22 maintains the control electrode voltage of the OLET 1 at the on-voltage.

It should be noted that in combination with the above formula for calculating the channel current in an OLET, it would be known that the light emission intensity of the OLET generally depends upon a combined current of its electron current and hole current, that is, the light emission intensity L of the OLET is related to the minimum electron current $|I_{DS-e}|$ or hole current $|I_{DS-h}|$. Returning to FIG. 4, it can be seen from the figure that, taking the interval of $V_{DS}>0$ as an example, if $V_{DS}$ remains constant, then when the gate voltage $V_g$ (e.g., $V_{Data}$) of the OLET changes from small to large in the bipolar region, the electron current $I_{DS-e}$ will gradually increase and the hole current $I_{DS-h}$ will gradually decrease. Therefore, if the maximum light emission intensity of the OLET 1 is desired, the electron current $|I_{DS-e}|$ of the OLET needs to be controlled to be equal to its hole current $|I_{DS-h}|$. That is:

$$WC_i/(2L)[\mu_e(V_{GS}-V_{TH-e})^2]=WC_i/(2L)[\mu_h(V_{DS}-(V_{GS}-V_{TH-h}))^2] \quad (4).$$

Taking the pixel circuit shown in FIG. 7 as an example, the first electrode of the OLET 1 is coupled to the second voltage terminal, which is a power supply voltage terminal for supplying the power supply voltage signal $V_{DD}$. The second electrode of the OLET 1 is coupled to the common voltage terminal, which is for supplying the common voltage signal $V_{SS}$. Assume that the common voltage terminal is grounded, that is, when the voltage of the second electrode of the OLET 1 is 0 V, it can be determined by calculating equation (4) that:

$$Vgm = \frac{\sqrt{\mu_e}}{\sqrt{\mu_h}+\sqrt{\mu_e}}V_s + \frac{\sqrt{\mu_e}}{\sqrt{\mu_h}+\sqrt{\mu_s}}V_{Th-e} + \frac{\sqrt{\mu_h}}{\sqrt{\mu_h}+\sqrt{\mu_s}}V_{Th-h};$$

where Vgm is the control electrode driving voltage corresponding to the maximum light emission intensity of the OLET 1, which can be supplied via the data signal $V_{Data}$ transferred through the data line Data, Vs is the voltage of the first electrode of the OLET 1, which can be supplied via the power supply voltage signal $V_{DD}$, $V_{TH-e}$ is the electron injection barrier voltage of the OLET 1, $V_{TH-h}$ is the hole injection barrier voltage of the OLET 1, $\mu_e$ is the electron mobility of the OLET 1, and $\mu_h$ is the hole mobility of the OLET 1.

Therefore, in case of a data signal $V_{Data} \in (0, Vgm)$ supplied via data line Data, the light emission control sub-circuit 22 controls the light emission intensity of the OLET 1 according to the written data signal $V_{Data}$, and the light emission intensity will increase monotonically with the increase of $V_{Data}$. In case of $V_{Data}$>Vgm, the light emission control sub-circuit 22 controls the light emission intensity of the OLET 1 according to the written data signal $V_{Data}$, and the light emission intensity will decrease with the increase of $V_{Data}$.

When the pixel circuit provided by the embodiments of the present disclosure is in use, the data signal $V_{Data}$ of the data line Data may be determined from the gray scale of a pixel or sub-pixel of a frame to be displayed. In this way, depending upon the magnitude of the data signal $V_{Data}$ supplied via the data line Data, the light emission control sub-circuit 22 may synchronously control the magnitude of the light emission current of the OLET 1 while controlling the OLET 1 to emit light, i.e., synchronously control the light emission intensity of the OLET 1, thereby controlling the gray scale displayed by the OLET 1.

Figure 8:
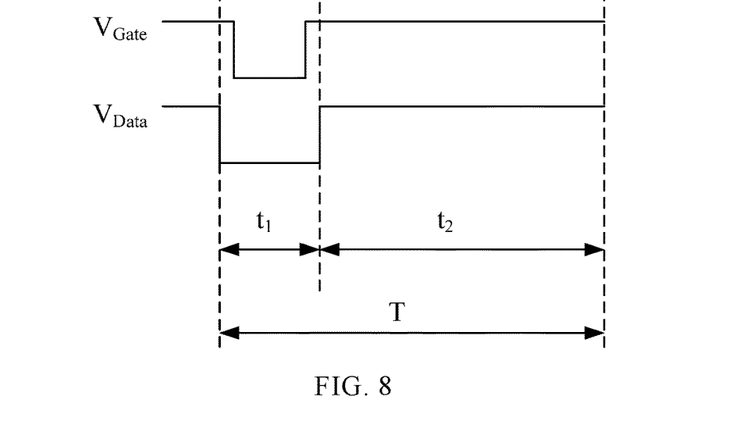
FIG. 8 is a timing control diagram of the pixel circuit shown in FIG. 7.

FIG. 8 shows a driving timing diagram for an OLET according to an embodiment of the present disclosure. In FIG. 8, one-frame period T of a frame to be displayed includes a data writing phase $t_1$ and a light emission phase $t_2$. A driving method for a pixel circuit will be described below in conjunction with FIGS. 7 and 8. The driving method includes the following steps.

In the data writing phase $t_1$, the input sub-circuit 21 writes a data signal $V_{Data}$ supplied via the data line Data into the light emission control sub-circuit 22 under the control of a gate scan signal $V_{Gate}$ supplied via the gate line Gate. Exemplarily, a control electrode of the organic light-emitting transistor may be maintained at a control electrode voltage corresponding to the data signal by means of supplying a first voltage signal to the light emission control sub-circuit.

In the light emission phase $t_2$, the light emission control sub-circuit 22 drives the OLET 1 to emit light according to the written data signal $V_{Data}$. Exemplarily, a second voltage signal may be supplied to the first electrode of the organic light-emitting transistor, and the organic light-emitting transistor may be driven to emit light through a driving current corresponding to the data signal and the second voltage signal supplied via the second voltage terminal. The data signal is determined from a gray scale to be displayed by the pixel circuit.

In some embodiments, it is assumed that in the pixel circuit shown in FIG. 7, the input sub-circuit 21 includes a second transistor $T_2$, which is a P-type transistor that is turned on at a low level. The light emission control sub-circuit 22 includes a storage capacitor C, a first terminal of which is coupled to a power supply voltage terminal $V_{DD}$.

In the data writing phase $t_1$, the gate line Gate supplies a gate scan signal $V_{Gate}$ of a low level, so that the second transistor $T_2$ is turned on and then the data signal $V_{Data}$ on the data line Data is output to the second terminal of the storage capacitor C. In alternative embodiments, at phase $t_1$, the data line Data may supply a data signal $V_{Data}$ of a low level. The storage capacitor C is charged under the effect of the data signal $V_{Data}$ and the power supply voltage signal $V_{DD}$, thereby writing in the data signal $V_{Data}$.

In the light emission phase $t_2$, the gate line Gate supplies a scan signal $V_{Gate}$ of a high level, so that the second transistor $T_2$ is turned off. In alternative embodiments, the data line Data may supply a data signal $V_{Data}$ of a high level. The storage capacitor C is discharged, thereby maintaining the control electrode voltage of the OLET 1 at the on-voltage based on the written data signal $V_{Data}$. This on-voltage is equal to the voltage $V_{Data}$ of the written data signal. In this way, a conducting current between the first electrode and the second electrode of the OLET 1 may be formed under the driving of the data signal $V_{Data}$ and the second voltage signal supplied via the second voltage terminal, thereby performing light emission display. The light emission duration of the OLET 1 depends upon the duration in which the control electrode voltage of the OLET 1 is maintained at the on-voltage by means of the storage capacitor C.

In the driving method for a pixel circuit provided by the embodiments of the present disclosure, the data signal $V_{Data}$ supplied via the data line Data is written by the input sub-circuit 21 into the light emission control sub-circuit 22 in the data writing phase $t_1$, and the corresponding OLET is controlled by the light emission control sub-circuit 22 to emit light according to the written data signal $V_{Data}$ in the light emission phase $t_2$. This may allow to implement active driving of the OLETs in the display apparatus so as to control the good light emission display of the OLETs.

It can be understood that a voltage of a data signal on the data line Data can be determined from a gray scale of a pixel or sub-pixel to be displayed by the pixel circuit in a frame to be displayed. In this way, in the light emission phase $t_2$, the storage capacitor C may allow to further control the light emission intensity of the OLET 1 according to the written data signal $V_{Data}$.

Exemplarily, a control electrode driving voltage $V_{gm}$ corresponding to the maximum light emission intensity of an OLET 1 satisfies:

$$Vgm = \frac{\sqrt{\mu_e}}{\sqrt{\mu_h} + \sqrt{\mu_e}} V_s + \frac{\sqrt{\mu_e}}{\sqrt{\mu_h} + \sqrt{\mu_s}} V_{Th-e} + \frac{\sqrt{\mu_h}}{\sqrt{\mu_h} + \sqrt{\mu_s}} V_{Th-h};$$

where Vs is the voltage of the first electrode of the OLET 1, $V_{TH-e}$ is the electron injection barrier voltage of the OLET 1, $V_{TH-h}$ is the hole injection barrier voltage of the OLET 1, $\mu_e$ is the electron mobility of the OLET 1, and $\mu_h$ is the hole mobility of the OLET 1.

In case of a data signal $V_{Data} \in (0, Vgm)$ supplied via data line Data, the storage capacitor C controls the light emission intensity of the OLET 1 according to the written data signal $V_{Data}$, and the light emission intensity will increase monotonically with the increase of $V_{Data}$. In case of $V_{Data}$>Vgm, the storage capacitor C controls the light emission intensity of the OLET 1 according to the written data signal $V_{Data}$, and the light emission intensity will decrease with the increase of $V_{Data}$.

Thus, in a driving method provided by the embodiments of the present disclosure, a data signal $V_{Data}$ of the data line Data is determined from a gray scale of a sub-pixel of a frame to be displayed, such that depending upon the magnitude of the data signal $V_{Data}$, the light emission control sub-circuit 22 synchronously controls the magnitude of the light emission current of the OLET while controlling the OLET to emit light, i.e., synchronously controls the light emission intensity of the OLET, thereby controlling the gray scale displayed by the OLET.

In some embodiments, since the output characteristic curve of a bipolar OLET is symmetrical with respect to the y-axis as shown in FIG. 4 above, the first electrode and the second electrode of the OLET 1 may have the same structure and function, that is, the first electrode of the OLET 1 can be inputted with a positive polarity voltage signal or a negative polarity voltage signal. When the first electrode of the OLET 1 is inputted with a positive polarity voltage signal, the second electrode of the OLET 1, of course, is required to be inputted with a negative polarity voltage signal accordingly; and when the first electrode of the OLET 1 is inputted with a negative polarity voltage signal, the second electrode of the OLET 1 is required to be inputted with a positive polarity voltage signal accordingly.

Thus, a second voltage terminal coupled to the first electrode of the OLET 1 may be configured to supply an AC voltage signal $V_{AC}$ as the second voltage signal.

Figure 9:
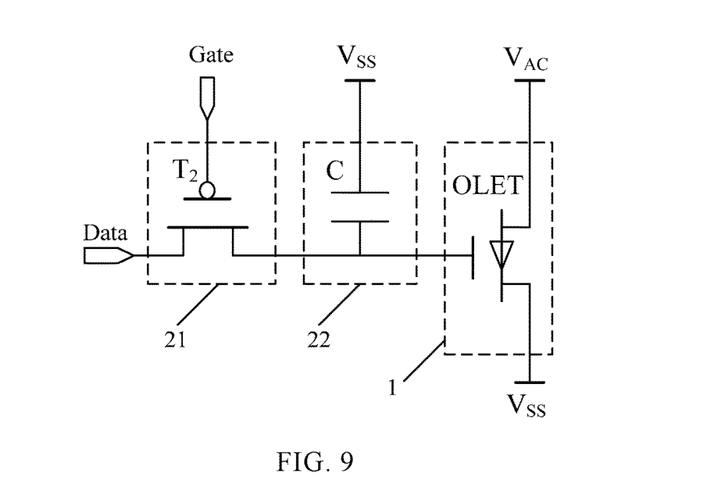
FIG. 9 is a schematic structural diagram of another pixel circuit according to an embodiment of the present disclosure.

FIG. 9 is a schematic structural diagram of another pixel circuit according to an embodiment of the present disclosure. In this embodiment, a first electrode of an OLET 1 is coupled to a second voltage terminal that is configured to supply the AC voltage signal $V_{AC}$, and a second electrode of the OLET 1 is coupled to a common voltage terminal that is configured to supply a common voltage signal $V_{SS}$.

Figure 10:
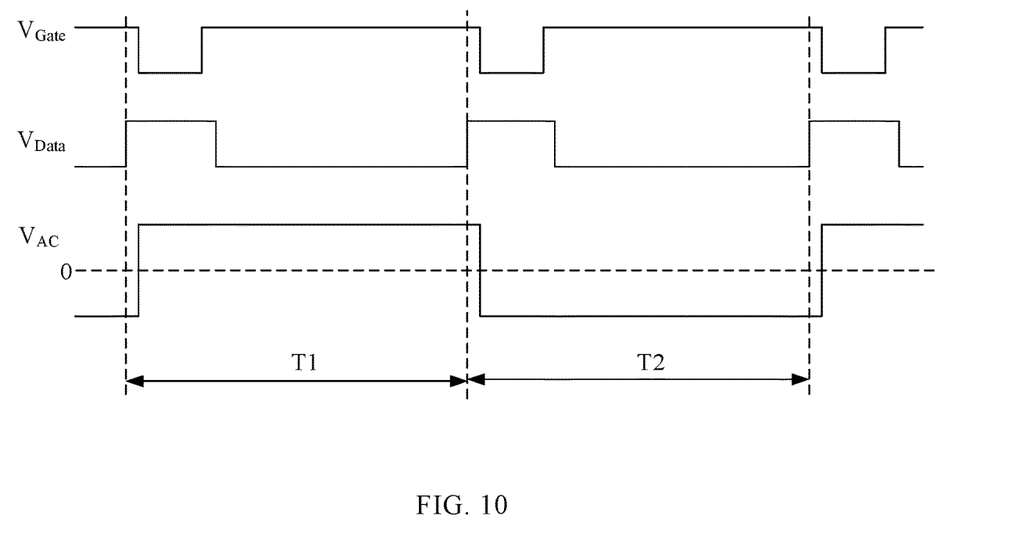
FIG. 10 is a timing control diagram of the pixel circuit shown in FIG. 9.

FIG. 10 shows an exemplary timing control diagram of the pixel circuit shown in FIG. 9. As shown in FIG. 10, the AC voltage signal $V_{AC}$ may be set to be a positive polarity voltage signal in a first frame period T1 and a negative polarity voltage signal in a second frame period T2, so that within two-successive-frame period, the first electrode of the OLET 1 is inputted with the positive polarity voltage signal and the negative polarity voltage signal respectively according to the frame period. Alternatively, the period in which the AC voltage signal $V_{AC}$ is in the positive polarity or the negative polarity may be set in any suitable manner.

In a pixel circuit including the OLET provided by the embodiments of the present disclosure, the AC voltage signal $V_{AC}$ is used as a signal transmitted via the second voltage terminal. This not only allows for using the AC voltage supplied via the mains supply directly, avoiding AC/DC filtering conversion, and improving the power utilization rate, but also effectively avoids the aging of the OLET 1 due to long-term unidirectional movement of its carriers, thus facilitating extension of the service life of the OLET 1.

Figure 11:
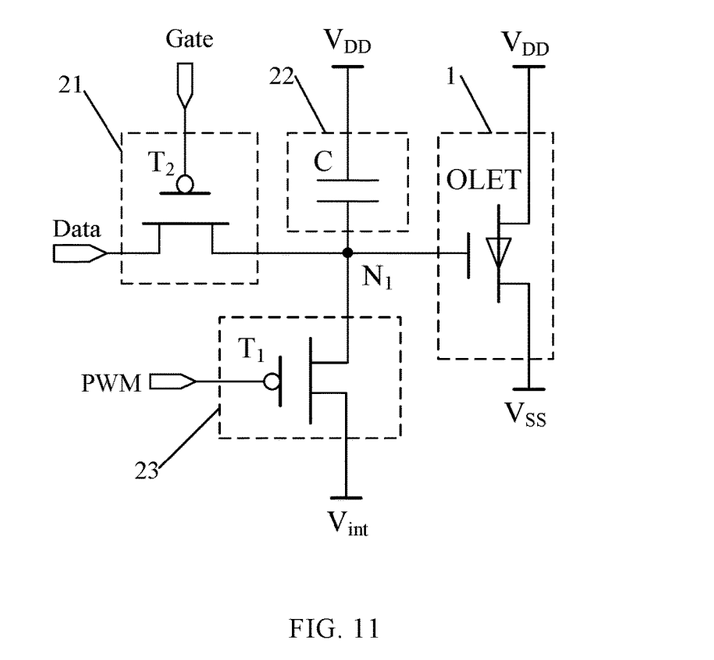
FIG. 11 is a schematic structural diagram of still another pixel circuit according to an embodiment of the present disclosure.

FIG. 11 is a schematic structural diagram of another pixel circuit according to an embodiment of the present disclosure. The pixel circuit in FIG. 11 is similar to that shown in FIG. 7 except that the pixel circuit further includes a light emission-off sub-circuit 23. The light emission-off sub-circuit 23 is coupled to a pulse width modulation signal line PWM, a third voltage terminal, and the control electrode of the OLET 1, and is configured to apply a third voltage signal $V_{int}$ supplied via the third voltage terminal to the control electrode of the OLET 1 under the control of a pulse width modulation (PWM for short) signal supplied via the pulse width modulation signal line PWM, so as to control the OLET 1 to be turned off and hence stop emitting light. In this embodiment, a duty cycle of the pulse width modulation signal is determined from the gray scale of a pixel to be displayed by the pixel circuit (i.e., the OLET 1).

In alternative embodiments, the light emission-off sub-circuit includes a first transistor $T_1$. A control electrode of the first transistor $T_1$ is coupled to the pulse width modulation signal line PWM, a first electrode of the first transistor $T_1$ is coupled to the third voltage terminal, and a second electrode of the first transistor $T_1$ is coupled to the control electrode of the OLET 1. The first transistor $T_1$ may be an N-type or a P-type transistor. Exemplarily, a P-type transistor is chosen to function as the first transistor $T_1$. In addition, in order to facilitate the wiring of the pixel circuit, the control electrode of the OLET 1, the second terminal of the storage capacitor C, the second electrode of the first transistor $T_1$, and the second electrode of the second transistor $T_2$ are coupled through a first node $N_1$, respectively.

According to this embodiment of the present disclosure, under the control of a corresponding pulse-width modulation signal, the light emission-off sub-circuit 23 is enabled to control the OLET 1 to stop emitting light, so as to implement precise control of the light emission duration of the OLET within every frame period of frames to be displayed. By exploiting changes between light and dark of the OLET within each frame period in this way, the gray scale displayed by the OLET can be accurately controlled.

Moreover, when the gray scale to be displayed by the OLET is controlled by way of controlling the light emission duration of the OLET as described above, it is unnecessary for the data signal $V_{Data}$ supplied via the data line Data in the pixel circuit to be determined from the gray scale of the sub-pixel of the frame to be displayed. The data signal $V_{Data}$ supplied via the data line Data may be equal to the control electrode voltage Vgm of the OLET that makes the OLET emit at its maximum light emission intensity, thus ensuring balanced injection of the electrons and holes in the OLET and in turn a maximum photoelectric conversion efficiency of the OLET. Since the light emission intensity of the OLET may be controlled to be at the maximum during the OLET emits light, the light emission efficiency of the OLET is effectively improved.

Figure 12:
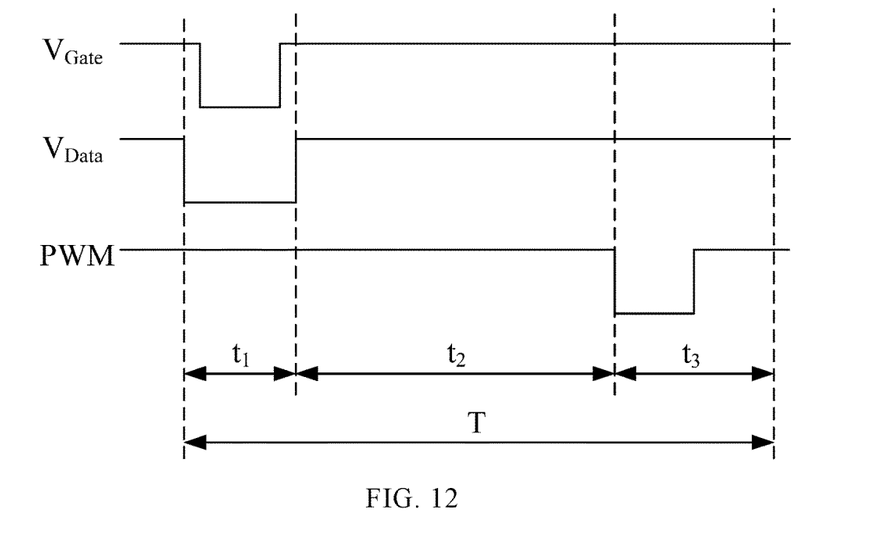
FIG. 12 is a timing control diagram of the pixel circuit shown in FIG. 11.

FIG. 12 is a timing control diagram for the pixel circuit shown in FIG. 11. As shown in FIG. 12, a frame period T of a frame to be displayed is divided into three phases: a data writing phase $t_1$, a light emission phase $t_2$, and a light emission-off phase $t_3$. In the data writing phase $t_1$, the input sub-circuit 21 writes the data signal $V_{Data}$ supplied via the data line Data into the light emission control sub-circuit 22 under the control of the gate scan signal $V_{Gate}$ supplied via the gate line Gate. The data signal $V_{Data}$ is equal to the control electrode driving voltage Vgm corresponding to the maximum light emission intensity of the OLET 1, ensuring that the OLET 1 may be continuously maintained at the maximum light emission intensity during the light emission phase $t_2$.

In the light emission phase $t_2$, the light emission control sub-circuit 22 outputs a written data signal $V_{Data}$ and the second voltage signal terminal outputs a second voltage signal to drive the OLET 1 to emit light.

In the light emission-off phase $t_3$, a third voltage signal $V_{int}$ is inputted to the OLET 1 to control the OLET 1 to stop emitting light. The duration of the light emission phase $t_2$ is determined from the gray scale of a sub-pixel of the frame to be displayed.

In some embodiments, the pixel circuit shown in FIG. 11 is taken as an example to explain as follows, where the pixel circuit is provided with the light emission-off sub-circuit 23. The first transistor $T_1$ of the light emission-off sub-circuit 23 is a P-type transistor and is turned on at a low level. In the light emission-off phase $t_3$, the pulse width modulation signal line PWM outputs a low level PWM signal, and the first transistor $T_1$ is turned on to output the third voltage signal $V_{int}$ supplied via the third voltage terminal to the control electrode of the OLET 1, thus controlling the OLET 1 to stop emitting light. The third voltage signal $V_{int}$ should be at an off-voltage of the OLET 1.

In the driving method provided by the embodiments of the present disclosure, after determining the light emitting duration corresponding to the light emission phase $t_2$ of the OLET 1 from the gray scale of the sub-pixel of the frame to be displayed, it may be possible to precisely control the OLET 1 to stop emitting light in the light emission-off phase $t_3$, thus achieving light and dark flicker of the OLET 1 within each frame period. This embodiment can accurately control the gray scale displayed by the OLET 1 by accurately controlling the light and dark flicker of the OLET 1 within each frame period, since the frame period is generally less than or equal to 1/60 second, i.e., far less than the recognition frequency of a displayed image by human eyes. In addition, when the gray scale displayed by OLET 1 is controlled by way of controlling the light emission duration of the OLET 1 as above-mentioned, the data signal $V_{Data}$ supplied via the data line Data in the pixel circuit is not required to be determined from a gray scale of a sub-pixel of a frame to be displayed. The data signal $V_{Data}$ supplied via the data line Data may be equal to the control electrode driving voltage Vgm corresponding to the maximum light emission intensity of the OLET 1, thus ensuring balanced injection of the electrons and holes in the OLET 1 and then a maximum photoelectric conversion efficiency of the OLET 1. That is, the OLET 1 can be continuously maintained at the maximum light emission intensity during the light emission phase $t_2$, which effectively improves the light emission efficiency of the OLET 1.

In some embodiments, in the driving method of the OLET provided by the above embodiments, the second voltage signal outputted from the second voltage signal terminal may be an AC voltage signal. In these embodiments an AC voltage signal is used as the second voltage signal, which not only allows for directly using the AC voltage supplied via the mains supply, avoiding AC/DC filtering conversion, and improving the power utilization rate, but also effectively avoids the aging of the OLET due to long-term unidirectional movement of its carriers, thus facilitating extension of the service life of the OLET.

Figure 13:
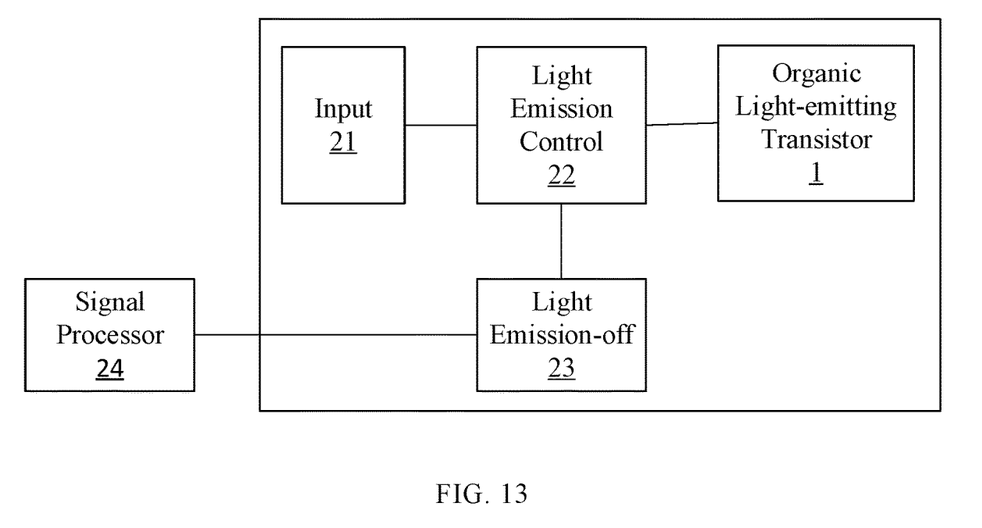
FIG. 13 is a schematic diagram of a display apparatus according to an embodiment of the present disclosure.

FIG. 13 illustrates a display apparatus according to an embodiment of the present disclosure, which comprises a pixel circuit including an OLET provided by the foregoing embodiments. The display apparatus provided by the embodiments of the present disclosure may achieve same beneficial effects as those that can be achieved by the pixel circuit provided by the foregoing embodiments, and thus are not repeated herein.

The display apparatus provided by the foregoing embodiments may be a product or component having a display function, such as a mobile phone, a tablet computer, a television, a display, a notebook computer, a digital photo frame, or a navigator.

As shown in the FIG. 13, embodiments of the present disclosure further provide a signal processor 24, which is for use with the pixel circuit provided with the light emission-off sub-circuit 23 in the above embodiments. The signal processor is configured to calculate the duty cycle of the pulse width modulation signal according to the gray scale to be displayed by the OLET, to generate a corresponding pulse width modulation signal, and output it to the light emission-off sub-circuit in the pixel circuit. That is, the signal processor provided by the embodiments of the present disclosure can convert a gray scale corresponding to an image pixel into a light emission duration, and adjust the brightness by adjusting the light emission duration of the light-emitting unit in the pixel circuit. It can be understood that the signal processor may be implemented by a signal processing integrated chip in the display apparatus.

In the description of the foregoing embodiments, specific features, structures, materials, or characteristics may be combined in a suitable manner in any one or more embodiments or examples.

The foregoing are only specific embodiments of the present disclosure, and the protection scope of the present disclosure is not limited thereto. Any variations or replacements that can be easily conceived of by a person skilled in the art within the technical scope disclosed in the present disclosure should be encompassed by the protection scope of this disclosure. Thus, the protection scope of the present disclosure shall be subject to the protection scope of the claims.

The invention claimed is:

1. A pixel circuit comprising:
an input sub-circuit;
a light emission control sub-circuit; and
an organic light-emitting transistor,
wherein the input sub-circuit is coupled to a gate line, a data line, and the light emission control sub-circuit, and is configured to write a data signal supplied via the data line into the light emission control sub-circuit under control of a gate scan signal supplied via the gate line, and
wherein the light emission control sub-circuit is coupled to a control electrode of the organic light-emitting transistor, and is configured to control a control electrode voltage of the organic light-emitting transistor according to the data signal to drive the organic light-emitting transistor to emit light;
wherein the light emission control sub-circuit comprises a first terminal coupled to a first voltage terminal and is configured to maintain the control electrode voltage corresponding to the data signal at the control electrode of the organic light-emitting transistor by utilizing a first voltage signal supplied via the first voltage terminal, and wherein the organic light-emitting transistor comprises a first electrode coupled to a second voltage terminal and is configured to emit the light responsive to a driving current corresponding to the data signal and a second voltage signal supplied via the second voltage terminal;
wherein the organic light-emitting transistor is a bipolar organic light-emitting transistor, and the second voltage terminal is configured to supply an AC voltage signal as the second voltage signal;
wherein the second voltage terminal is configured to, during every two consecutive frames, supply a positive polarity voltage signal and negative polarity voltage signal alternately on a per frame basis.

2. The pixel circuit of claim 1, further comprising:
a light emission-off sub-circuit, wherein the light emission-off sub-circuit is coupled to a pulse width modulation signal line and the control electrode of the organic light-emitting transistor, and is configured to control the organic light-emitting transistor to stop emitting the light according to a pulse width modulation signal supplied via the pulse width modulation signal line,
wherein a duty cycle of the pulse width modulation signal is determined from a gray scale to be displayed by the pixel circuit.

3. The pixel circuit of claim 2, wherein a voltage of the data signal is the control electrode voltage at which the organic light-emitting transistor is configured to emit the light at a maximum light emission intensity.

4. The pixel circuit of claim 2, wherein the light emission-off sub-circuit comprises:
a first transistor comprising a first control electrode that is coupled to the pulse width modulation signal line, a first electrode that is coupled to a third voltage terminal, and a second electrode that is coupled to the control electrode of the organic light-emitting transistor, wherein the first transistor is configured to be turned on in response to the pulse width modulation signal being at an active level, to control the organic light-emitting transistor to stop emitting the light by applying a third voltage signal supplied via the third voltage terminal to the control electrode of the organic light-emitting transistor.

5. The pixel circuit of claim 1, wherein the first voltage terminal is coupled to the second voltage terminal.

6. The pixel circuit of claim 1, wherein the input sub-circuit comprises:
a second transistor comprising a second control electrode that is coupled to the gate line, a first electrode that is coupled to the data line, and a second electrode that is coupled to the light emission control sub-circuit.

7. The pixel circuit of claim 1, wherein the light emission control sub-circuit comprises:
a storage capacitor comprising a first terminal that is coupled to a first voltage terminal, and a second terminal that is coupled to the control electrode of the organic light-emitting transistor and an output terminal of the input sub-circuit.

8. The pixel circuit of claim 1, wherein the second voltage terminal comprises a power supply voltage terminal, and a second electrode of the organic light-emitting transistor is coupled to a common voltage terminal.

9. A driving method for a pixel circuit, wherein the pixel circuit comprises an input sub-circuit, a light emission control sub-circuit, and an organic light-emitting transistor, the driving method comprising the following during a frame period of a frame to be displayed:
writing, by the input sub-circuit in a data writing phase, a data signal supplied via a data line into the light emission control sub-circuit under control of a gate scan signal supplied via a gate line; and
driving, by the light emission control sub-circuit in a light emission phase, the organic light-emitting transistor to emit light according to the data signal,
wherein the writing the data signal supplied via the data line into the light emission control sup-circuit comprises: maintaining, at a control electrode of the organic light-emitting transistor, a control electrode voltage corresponding to the data signal by supplying a first voltage signal to the light emission control sub-circuit,
wherein the driving the organic light-emitting transistor by the light emission control sub-circuit according to the data signal comprises supplying a second voltage signal to a first electrode of the organic light-emitting transistor, and driving the organic light-emitting transistor to emit the light through a driving current corresponding to the data signal and the second voltage signal;
wherein the organic light-emitting transistor is a bipolar organic light-emitting transistor, and the second voltage signal is an AC voltage signal;
wherein, during every two consecutive frames, a positive polarity voltage signal and a negative polarity voltage signal are alternately applied to the first electrode of the organic light-emitting transistor on a per frame basis.

10. The driving method of claim 9, wherein a voltage of the data signal is determined from a gray scale to be displayed by the pixel circuit.

11. The driving method of claim 9, wherein the frame period further comprises a light emission-off phase, and the driving method further comprises:
controlling, in the light emission-off phase, the organic light-emitting transistor to stop emitting the light by applying a third voltage signal to a control electrode of the organic light-emitting transistor,
wherein a duration of the light emission phase is determined from a gray scale of a pixel or a sub-pixel of the frame to be displayed.

12. The driving method of claim 11, wherein a voltage of the data signal is a control electrode voltage of the organic light-emitting transistor at which the organic light-emitting transistor is configured to emit the light at a maximum light emission intensity.

13. A display apparatus comprising the pixel circuit of claim 1.

14. A signal processor for use with the pixel circuit of claim 2, wherein the signal processor is configured to calculate the duty cycle of the pulse width modulation signal from the gray scale to be displayed by the pixel circuit, and to generate and output a corresponding pulse width modulation signal to the light emission-off sub-circuit in the pixel circuit.

* * * * *